(12) United States Patent
Ryu et al.

(10) Patent No.: US 11,856,700 B2
(45) Date of Patent: Dec. 26, 2023

(54) HORIZONTALLY MOUNTED CAPACITOR MODULE AND ELECTRONIC DEVICE INCLUDING SAME

(71) Applicant: SAMSUNG ELECTRONICS CO., LTD., Suwon-si (KR)

(72) Inventors: Chunghyun Ryu, Hwaseong-si (KR); Byungok Kang, Hwaseong-si (KR); Su-Yong An, Asan-si (KR); Jongwoo Jang, Seoul (KR); Insub Kwak, Seoul (KR); Teck Su Oh, Anyang-si (KR); Geurim Jung, Hwaseong-si (KR); Sang-Ho Park, Yongin-si (KR); Sung-Ki Lee, Seoul (KR)

(73) Assignee: Samsung Electronics Co., Ltd.

( * ) Notice: Subject to any disclaimer, the term of this patent is extended or adjusted under 35 U.S.C. 154(b) by 287 days.

(21) Appl. No.: 17/225,209

(22) Filed: Apr. 8, 2021

(65) Prior Publication Data

US 2021/0345489 A1 Nov. 4, 2021

(30) Foreign Application Priority Data

Apr. 29, 2020 (KR) .................. 10-2020-0052095
Nov. 18, 2020 (KR) .................. 10-2020-0154402

(51) Int. Cl.
*H01G 9/08* (2006.01)
*H05K 1/18* (2006.01)
(Continued)

(52) U.S. Cl.
CPC ............... *H05K 1/182* (2013.01); *H01G 9/08* (2013.01); *H01G 9/008* (2013.01); *H01G 9/045* (2013.01); *H05K 2201/09063* (2013.01); *H05K 2201/09781* (2013.01); *H05K 2201/10015* (2013.01)

(58) Field of Classification Search
CPC .......... H01G 9/008; H01G 9/045; H01G 9/06; H01G 9/08; H01G 9/14; H01G 2/02; (Continued)

(56) References Cited

U.S. PATENT DOCUMENTS 6,208,503 B1 * 3/2001 Shimada ................ H01G 11/48
361/511
6,305,972 B1 10/2001 Isbell et al.
(Continued)

FOREIGN PATENT DOCUMENTS

CN 101916662 A 12/2015
CN 209912743 U 1/2020
(Continued)

OTHER PUBLICATIONS

A Degradation Model Al Electrolytic Capacitors for LED Drivers_ Sun et al._pp. 1-4_2015.*

*Primary Examiner* — Timothy J Thompson
*Assistant Examiner* — Guillermo J Egoavil
(74) *Attorney, Agent, or Firm* — Fish & Richardson P.C.

(57) ABSTRACT

A capacitor module horizontally mounted on a PCB and including a case including a first side surface, an opposing second side, a first electrode pad and a second electrode pad disposed at the first side surface, and a third electrode pad disposed at the second side surface, and an electrolytic capacitor including a dielectric extending in a first horizontal direction, a first electrode contacting the first electrode pad and a second electrode contacting the second electrode pad, wherein the first electrode pad is spaced apart from second electrode pad in a second horizontal direction.

20 Claims, 16 Drawing Sheets

(51) Int. Cl.
*H01G 9/008* (2006.01)
*H01G 9/045* (2006.01)

(58) Field of Classification Search
CPC .......... H01G 2/10; H01G 2/103; H01G 2/106; H01G 4/224; H01G 4/228; H01G 9/10; H05K 1/182; H05K 1/18; H05K 2201/09063; H05K 2201/09781; H05K 2201/10015; H05K 2201/10606
USPC .......................................... 361/500; 174/17 R
See application file for complete search history.

(56) References Cited

U.S. PATENT DOCUMENTS

| | | | |
|---|---|---|---|
| 8,451,617 B2 | 5/2013 | Chan et al. | |
| 10,624,208 B1* | 4/2020 | Gross | .................. H05K 3/3442 |
| 2013/0286612 A1 | 10/2013 | Iwasaki et al. | |
| 2018/0242460 A1 | 8/2018 | Varga et al. | |
| 2019/0115161 A1 | 4/2019 | Will et al. | |
| 2019/0355526 A1 | 11/2019 | Yokoura et al. | |
| 2021/0304961 A1* | 9/2021 | Hadwan | .................. H01G 2/10 |

FOREIGN PATENT DOCUMENTS

| | | | | |
|---|---|---|---|---|
| EP | 3399639 A1 | 11/2018 | | |
| JP | 2003197470 A | * | 7/2003 | ............. H01G 9/004 |
| JP | 3729257 B2 | 12/2005 | | |
| JP | 4683176 B2 | 5/2011 | | |
| JP | 2014116522 A | 6/2014 | | |
| KR | 100193568 B1 | 6/1990 | | |
| KR | 200160076 Y1 | 11/1999 | | |
| KR | 100730083 B1 | 6/2007 | | |
| KR | 20160020331 A | 2/2016 | | |
| KR | 1020170082161 A | 7/2017 | | |

* cited by examiner

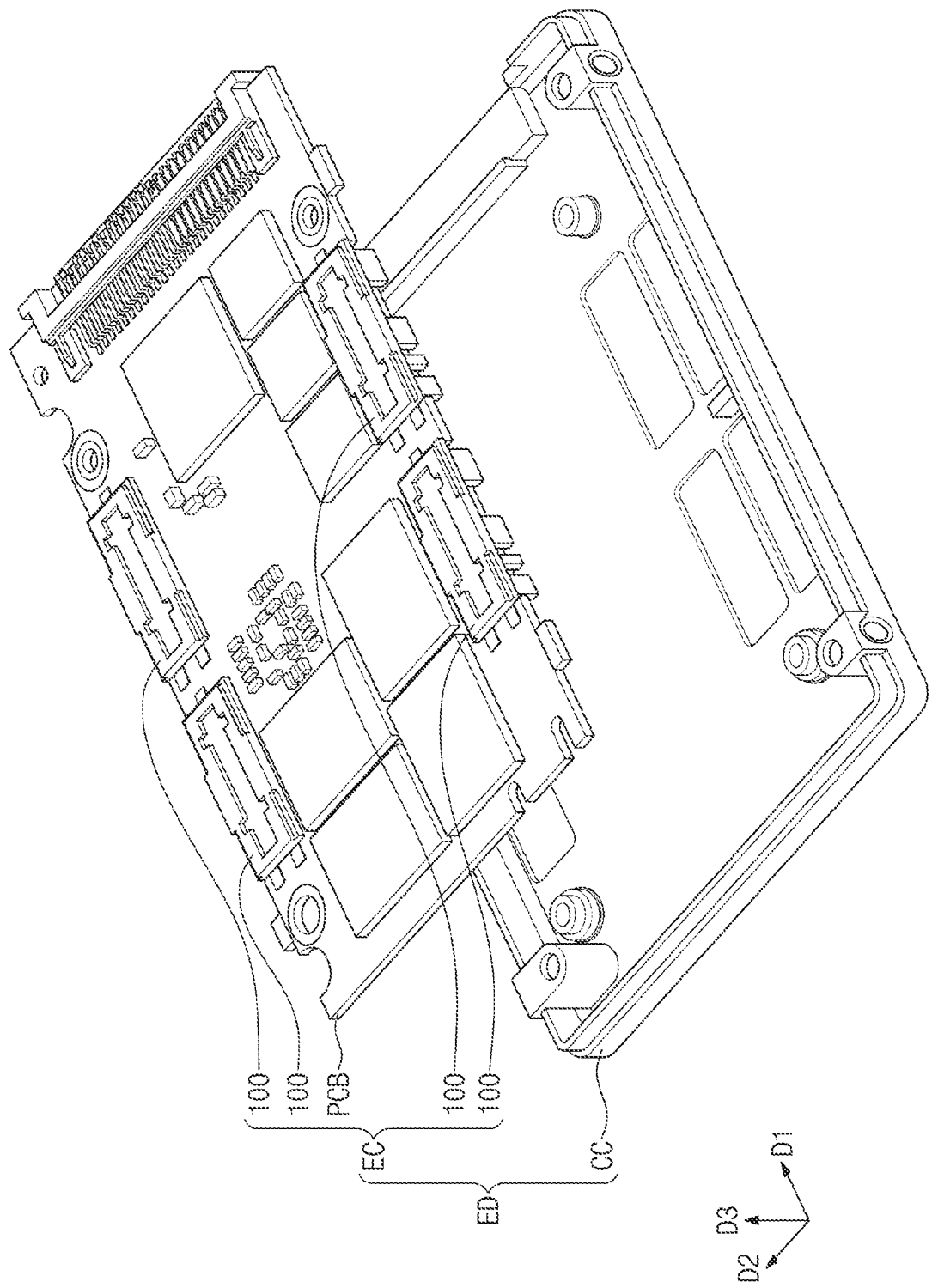

HORIZONTALLY MOUNTED CAPACITOR MODULE AND ELECTRONIC DEVICE INCLUDING SAME

CROSS-REFERENCE TO RELATED APPLICATIONS

This application claims priority under 35 U.S.C. § 119 to Korean Patent Application No. 10-2020-0052095 filed on Apr. 29, 2020 and Korean Patent Application No. 10-2020-0154402 filed on Nov. 18, 2020, the collective subject matter of which is hereby incorporated by reference.

BACKGROUND

Embodiments of the inventive concept relate generally to capacitor modules and electronic devices including same. More particularly, embodiments of the inventive concept relate to horizontally mounted capacitor modules providing improved integration density, as well as electronic devices including this type of capacitor module.

Electronic devices including one or more semiconductor chips or packages routinely include electronic circuit(s) including various components that collectively provide a great variety of functionality. In many electronic devices, the components are mounted on a printed circuit board (PCB). For example, various components, such as a controller, a flash memory, a buffer memory, an input/output (I/O) port, an electrolytic capacitor, and the like, may be mounted on a PCB in order to implement a semiconductor device, such as a solid state drive (SSD).

The various geometric dimensions (e.g., height, width, length) of the constituent components, as well as minimal spacing requirements between the components, determine the overall size of an electronic device. Some components of a semiconductor device may have predetermined dimensions that are defined by certain functional and/or physical characteristics. For example, an electrolytic capacitor may be used in some semiconductor devices to accumulate a desired level of electrical charge. Here, the physical size of the electrolytic capacitor will correspond to an amount of desired capacitance for the electrolytic capacitor. Hence, the size of the electrolytic capacitor may be quite difficult to reduce due to a maximum capacitance requirement (or specification) demanded by related circuitry or functionality. As a result, the integration density (e.g., a degree of compactness) of a collection of components including one or more electrolytic capacitor(s) may be limited.

SUMMARY

Embodiments of the inventive concept provide horizontally mounted capacitor modules capable of improving the degree of component integration within an electronic device.

According to an embodiment, a capacitor module includes; a case, horizontally mounted on a printed circuit board (PCB) having principal surfaces horizontally extending in a first direction and a second direction perpendicular to the first direction, and including a first side surface, a second side surface opposing the first side surface, a first electrode pad and a second electrode pad disposed at the first side surface, and a third electrode pad disposed at the second side surface, and an electrolytic capacitor including a dielectric extending in the first direction, a first electrode electrically connected to the first electrode pad and a second electrode electrically connected to the second electrode pad, wherein the second electrode pad is spaced apart from the first electrode pad in the second direction.

According to an embodiment, an electronic device includes; a printed circuit board (PCB) having principal surfaces horizontally extending in a first direction and a second direction perpendicular to the first direction and including a mounting area, a first contact terminal, a second contact terminal and a third contact terminal, a case configured to be horizontally mounted on the PCB at least partially within the mounting area and including a first side surface, a second side surface opposing the first side surface, a first electrode pad and a second electrode pad disposed at the first side surface, and a third electrode pad disposed at the second side surface, and an electrolytic capacitor including a dielectric extending in the first direction, a first electrode and a second electrode spaced apart from the first electrode in the second direction, wherein the electrolytic capacitor is mounted on the case by connecting the first electrode to the first electrode pad and connecting the second electrode to the second electrode pad, and the case is horizontally mounted within the mounting area of the PCB by connecting the first electrode pad to the first contact terminal, the second electrode pad to the second contact terminal, and the third electrode pad to the third contact terminal.

According to an embodiment, a capacitor module configured to be horizontally mounted on a printed circuit board (PCB), the PCB having an upper surface and a lower surface horizontally extending in a first direction and a second direction perpendicular to the first direction includes; a case including a frame, a first side surface, a second side surface opposing the first side surface, a first electrode pad and a second electrode pad disposed at the first side surface, and a third electrode pad disposed at the second side surface, and a cylindrical electrolytic capacitor including a dielectric extending in the first direction, a first electrode contacting the first electrode pad and a second electrode contacting the second electrode pad, wherein the first electrode pad is spaced apart from second electrode pad in the second direction, and the frame substantially surrounds side surfaces of the cylindrical electrolytic capacitor.

BRIEF DESCRIPTION OF THE DRAWINGS

The above and other objects and features of the inventive concept may be readily appreciated upon consideration of the following detailed description together with the accompanying drawings, in which:

FIG. 10 is a perspective view illustrating an electronic device including an electronic device according to embodiments of the inventive concept.

DETAILED DESCRIPTION

Embodiments of the inventive concept will now be described in some additional detail with reference to the accompanying drawings. Unless otherwise defined, all terms used herein, including technical or scientific terms, have the same meanings as those generally understood by those skilled in the art. Such terms as those defined in a generally used dictionary are to be interpreted as having meanings equal to the contextual meanings in the relevant field of art, and are not to be interpreted as having ideal or excessively formal meanings unless clearly defined as having such in the present application.

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Throughout the drawings, first, second and third directions (D1, D2 and D3) are shown. Assuming an arbitrarily defined set of axes, the first direction D1 may be understood as first horizontal direction in which a capacitor module primarily extends; the second direction D2 may be understood as a second horizontal direction substantially perpendicular to the first direction D1; and the third direction D3 may be understood as a vertical direction perpendicular to a plane defined by the first direction D1 and the second direction D2. Here, the plane defined by the first direction D1 and the second direction D2 may extend substantially in parallel with a primary surface of a printed circuit board (PCB), whereas the third direction D3 may be a direction in which electrode pads of the capacitor module and contact terminals of the PCB are connected.

Figure 1:
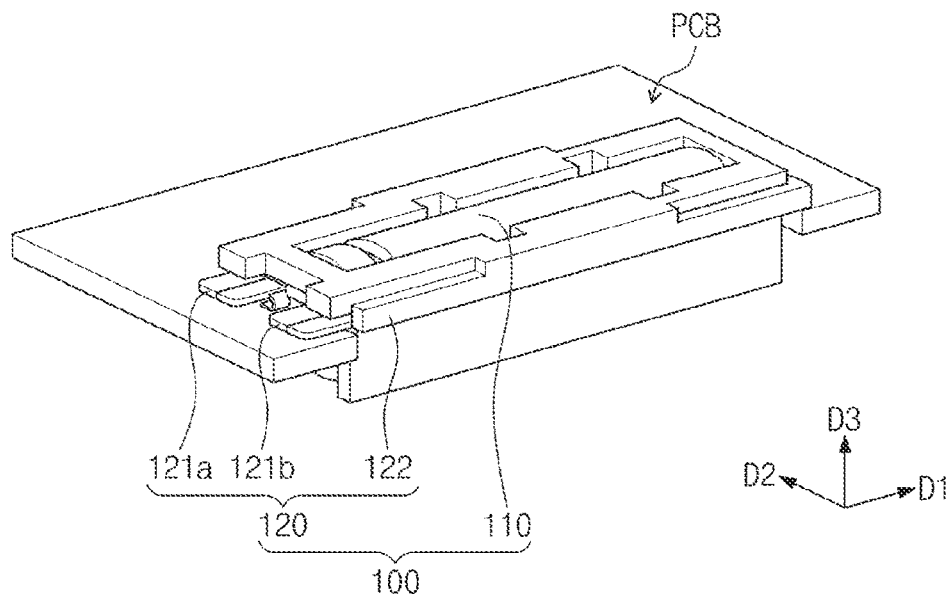
FIG. 1 is a perspective view illustrating an electronic device according to embodiments of the inventive concept.

Figure (FIG. 1 is a perspective view illustrating in relevant portion an electronic device according to embodiments of the inventive concept. Referring to FIG. 1, the electronic device may include a PCB and a capacitor module 100 mounted on the PCB. In some embodiments, the electronic device may be a circuit, such as a solid state drive (SSD), a main board, or the like, including various electronic components.

The capacitor module 100 may be electrically connected to one or more circuit(s) or module(s) of the electronic device through the PCB. For example, assuming the electronic device is an SSD, the capacitor module 100 may be electrically connected to a controller, a buffer memory, a flash memory, an I/O port, and the like through the PCB.

The capacitor module 100 may generally include an electrolytic capacitor 110 and a case 120. As will be understood by those skilled in the art, the electrolytic capacitor 110 will include an anode and a cathode and may be used (e.g., charged and discharged) to store/provide electrical energy. In some embodiments, the electrolytic capacitor 110 may be an aluminum (Al) electrolytic capacitor. In this regard, the electrolytic capacitor 110 will include a dielectric. For example, the dielectric of the electrolytic capacitor 110 may include an aluminum thin film disposed within a cylindrical metal case and extending in the first direction D1. In this example, the dielectric of the electrolytic capacitor 110 may store electrical energy using an aluminum oxide film formed on a surface of the aluminum thin film.

The case 120 may be used to mechanically "mount" (e.g., attach, couple, mechanically connect, mechanically contact, and/or electrically connect) the electrolytic capacitor 110. In this regard, the case 120 may protect the electrolytic capacitor 110 environmental factors and physical impact. In some embodiments, the case 120 will be physically fixed to the electrolytic capacitor 110. The case 120 may include electrode pads used to respectively mount the anode and the cathode of the electrolytic capacitor 110.

Figure 2:
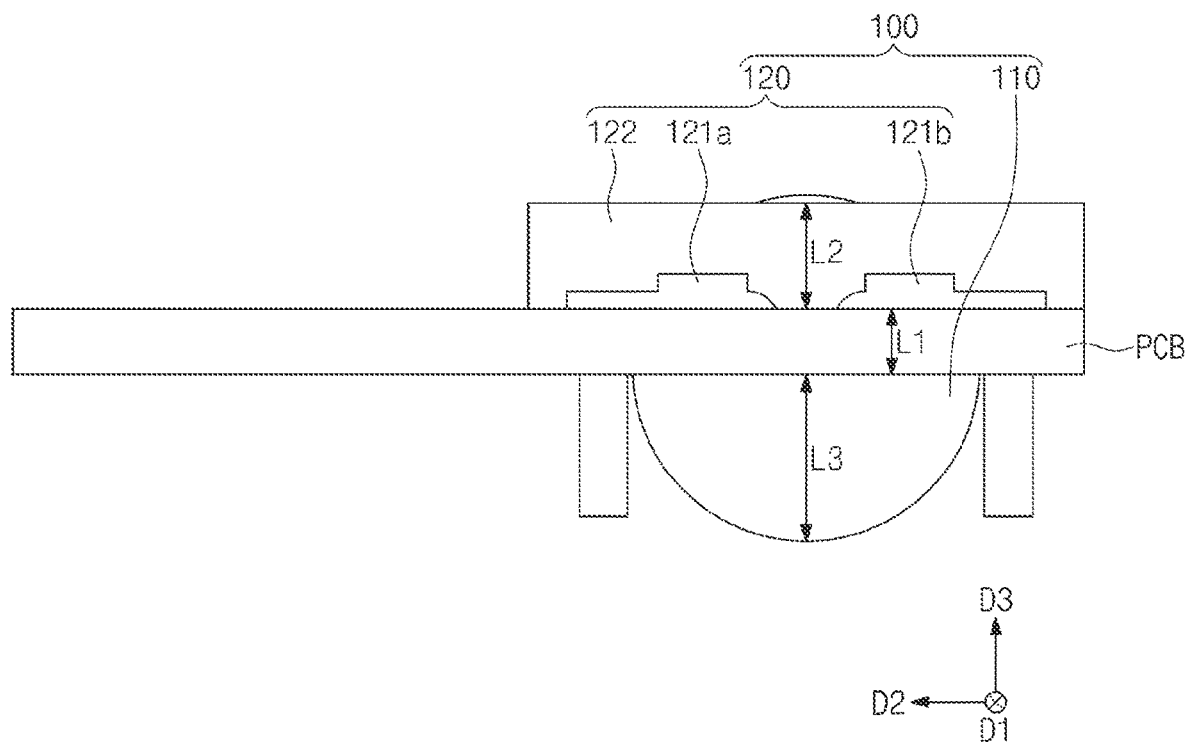
FIG. 2 is a side view of FIG. 1.

In FIGS. 1 and 2, the case 120 includes a first electrode pad 121a, a second electrode pad 121b, and a frame 122. The first electrode pad 121a may mount (e.g., mechanically connect and/or electrically connected) one of the anode and the cathode of the electrolytic capacitor 110. The second electrode pad 121b may mount the other one of the anode and the cathode of the electrolytic capacitor 110. The frame 122 may substantially surround at least part of the electrolytic capacitor 110.

In some embodiments, the first electrode pad 121a and the second electrode pad 121b may mechanically support the capacitor module 100 mounted on the PCB, and may stably fix the capacitor module 100 as mounted on the PCB. In addition the first electrode pad 121a and the second electrode pad 121b may provide electrical connection paths for sending/receiving electrical energy to/from the anode and the cathode of the electrolytic capacitor 110.

In some embodiments, the capacitor module 100 may be electrically connected to the PCB through the first electrode pad 121a and the second electrode pad 121b. The capacitor module 100 may send/receive electrical energy from a device electrically connected to (or through) the PCB, or an another component mounted on the PCB. That is, the electrolytic capacitor 110 may be charged or discharged through the first electrode pad 121a and the second electrode pad 121b.

In some embodiments, the case 120 may further include at least one electrode pad that mechanically connects (or fixes) the capacitor module 100 to the PCB. For example, the case 120 may further include at least one dummy electrode pad (not shown in FIG. 1) that mechanically supports the capacitor module 100 on the PCB. One example of a capacitor module including at least one dummy electrode pad will be described in some additional detail with reference to FIG. 5.

In some embodiments, the capacitor module 100 may be mounted on the PCB using an automated manufacturing process, such as surface mount technology (SMT). That is, the electrode pads 121a and 121b of the case 120 of the capacitor module 100 may be mounted on the PCB using this type of automated manufacturing process. Accordingly, since an electronic device including the capacitor module 100 may be manufactured using an automated manufacturing process, a defect rate associated with the electronic device may be reduced over non-automated assembly processes, such as hand soldering and productivity of the electronic device may be improved.

In some embodiments, the electronic device may be an SSD that meets the Low-Profile PCI express (PCIe) standard. That is, the electrolytic capacitor 110 may be a power supply unit configured to provide electrical energy (i.e., capacitance charge) that meets the Low-Profile PCIe standard. Additional electronic components routinely associated with a Low-Profile PCIe design may be mounted on the PCB.

The electrolytic capacitor 110 may have a volume consistent with the overall design of the electronic device and its intended functionality with the design. Assuming as an example that the electrolytic capacitor 110 is an aluminum electrolytic capacitor, the electrolytic capacitor 110 may have a relatively large size, as compared with other capacitor types (e.g., a multilayer ceramic capacitor, a tantalum capacitor, etc.), but may be manufactured at a lower cost that the other capacitor types. Accordingly, the electrolytic capacitor 110 may have a defined volume necessary to accumulate electrical charge corresponding to a required capacitance.

Embodiments of the inventive concept provide an approach that reduces wasted mounting space typically associated with conventional approaches to the mounting of an electrolytic capacitor. For example, the electrolytic capacitor 110 of FIG. 1 may be horizontally mounted on the PCB to minimize wasted mounting space.

In contrast, electrolytic capacitors are usually mounted on a surface of PCB in a vertically orthogonal orientation using conventional approaches. That is, using the nomenclature established above, electrolytic capacitors are conventionally mounted on a PCB in the third direction D3. Unfortunately, as the conventionally mounted electrolytic capacitor protrudes upward from the PCB, the physical volume necessary to accommodate the PCB within an electronic device is significant—primarily due to the size and stance of the electrolytic capacitor. This outcome results in considerable wasted mounting space.

In great contrast, and as illustrated in FIG. 1, some embodiments of the inventive concept may include the capacitor module 100 including the electrolytic capacitor 110 that is horizontally mounted on the PCB. This configuration reduces the wasted mounting space typically associated with the PCB (e.g., space vertically above an horizontal upper surface of the PCB, and/or space vertically below a horizontal lower surface of the PCB). This result allows an electronic device incorporating the PCB to have a reduced vertical profile (or height), thereby improving a degree of integration for the electronic device.

FIG. 2 is a side view (e.g., from the first direction D1) further illustrating the electronic device of FIG. 1. Here, the capacitor module 100 may be mounted on the PCB in substantially the same plane as the primary surfaces (i.e., the upper and lower surfaces) of the PCB. For example, the capacitor module 100 may be mounted to substantially overlap portions of the PCB, such that the capacitor module 100 occupies space both under and over the PCB, as measured in the third direction D3.

Accordingly, in contrast to the conventionally mounted and vertically oriented electrolytic capacitors, the capacitor module 100 of FIG. 2 shares with the PCB a vertical space having a first height L1 corresponding to a thickness (measured in the third direction D3) of the PCB. Further, the frame 122 of the case 120 of the capacitor module 100 may vertically extend above the PCB by a second height L2, and the body (e.g., having a cylindrical radius) of the electrolytic capacitor 110 of the capacitor module 100 may vertically extend below the PCB by a third height L3.

In some embodiments, the first height L1 may be about 1.0 mm, the second height L2 may be about 1.7 mm, and the third height L3 may be about 2.6 mm. However, the scope of the inventive concept is not limited thereto, and the first, second, and third heights L1, L2 and L3 may vary with (e.g.) design, intended use, specification requirement(s), number of components mounted on the PCB, etc.

Figure 3A:
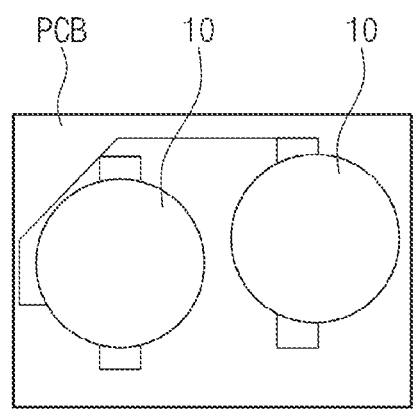
FIGS. 3A, 3B, 3C and 4 are respectively views variously illustrating conventional, comparative examples of electronic devices including electrolytic capacitors vertically mounted on PCBs.
Figure 3B:
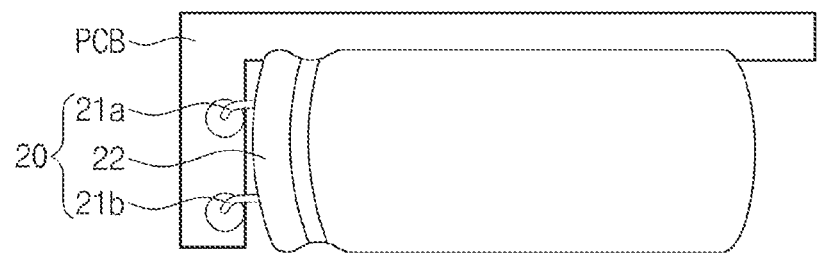
Figure 3C:
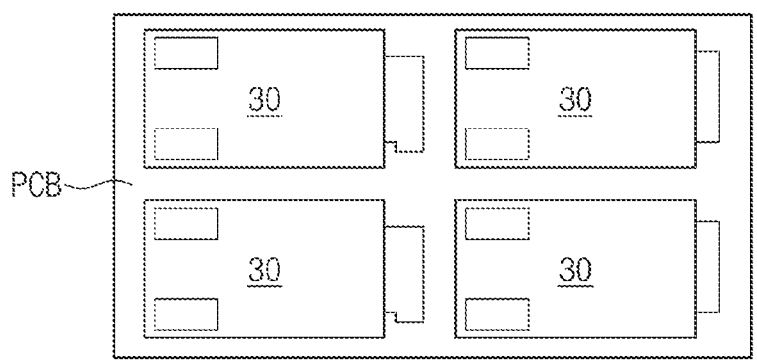

FIGS. 3A, 3B and 3C are respectively views variously illustrating conventional, comparative examples of electronic devices including electrolytic capacitors vertically mounted on a PCB.

Referring to FIG. 3A, an electronic device may include electrolytic capacitors 10 vertically mounted on a PCB. In this case, a vertical space equal to the height of electrolytic capacitors 10 (e.g., a cylindrical body) may become wasted mounting space in relation to the PCB, thereby increasing the overall physical size of the electronic device and reducing a degree of integration for the electronic device.

Referring to FIG. 3B, an electronic device includes an electrolytic capacitor 20 vertically mounted on a PCB. Here, the electrolytic capacitor 20 may include a first electrode 21a, a second electrode 21b, and a dielectric 22. One of the first electrode 21a and the second electrode 21b may be an anode, and the other may be a cathode. The dielectric 22 may be a medium capable of storing electrical energy.

In the illustrated example of FIG. 3B, the first electrode 21a and the second electrode 21b of the electrolytic capacitor 20 may be connected with the PCB using a soldering process. As a result, the PCB including the electrolytic capacitor 20 may suffer from a relatively high defect rate and low productivity, as compared with embodiments of the inventive concept that use an automated manufacturing process.

Referring to FIG. 3C, an electronic device includes multiple tantalum capacitors 30 mounted on a PCB. Here, the tantalum capacitors 30 are vertically mounted on the PCB, and therefore a vertical space equal to at least the height of the tantalum capacitors 30 may become wasted mounting space relative to an upper (or lower) surface the PCB on which the tantalum capacitors 30 are mounted.

Figure 4:
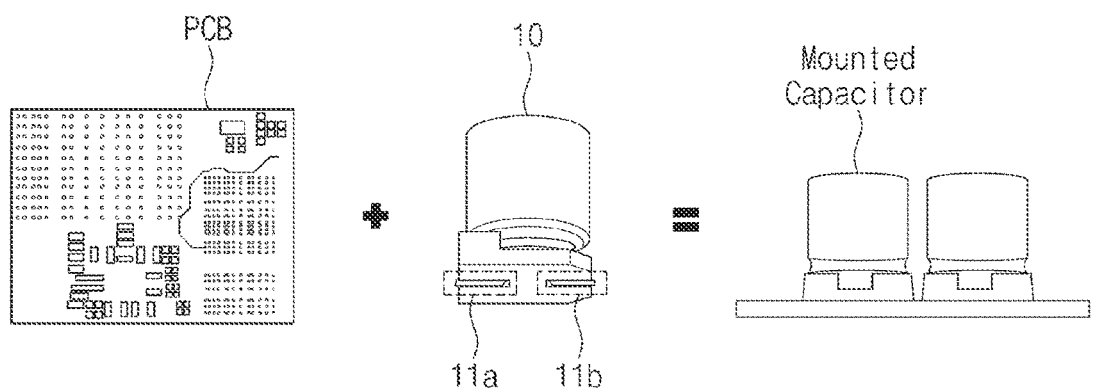

The foregoing, conventional results are further illustrated in the conceptual view of FIG. 4. Here, the PCB, the electrolytic capacitors 10, and an electronic device provided on the PCB are shown.

Each of the electrolytic capacitors 10 may include a first electrode 11a and a second electrode 11b. The electrolytic capacitors 10 may be mounted on the PCB using surface mounting technology, however a vertical space above the PCB equal to a height of the electrolytic capacitors 10 may become wasted mounting space.

Figure 5:
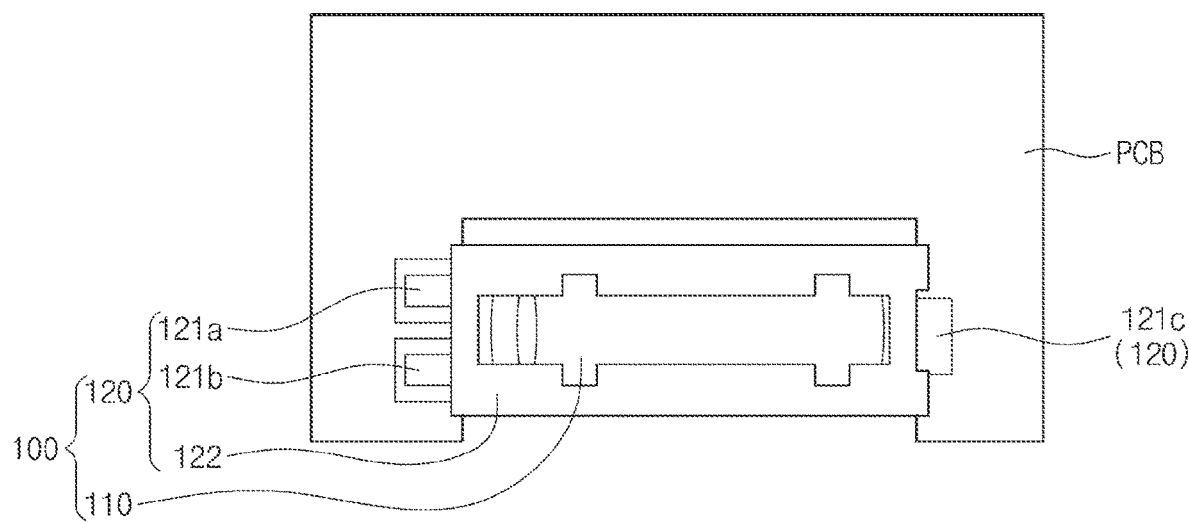
FIG. 5 is a view illustrating an electronic device including a capacitor module according to embodiments of the inventive concept.

FIG. 5 is a plan (or top down) view illustrating an electronic device including a PCB and a horizontally mounted capacitor module according to embodiments of the inventive concept. Here again, the capacitor module 100 is assumed to include the electrolytic capacitor 110 and the case 120. The case 120 includes a first electrode pad 121a, a second electrode pad 121b, a third electrode pad 121c, and the frame 122. The first electrode pad 121a, the second electrode pad 121b, and the frame 122 may be substantially and respectively similar to the first electrode pad 121a, the second electrode pad 121b, and the frame 122 of FIG. 1.

As an example, the electrolytic capacitor 110 is assumed to be an aluminum electrolytic capacitor that is horizontally mounted on the PCB through the case 120. In contrast to the comparative example of FIGS. 3A, 3B, 3C and 4, the electrolytic capacitor 110 of FIG. 5 may be horizontally mounted at least partially within (e.g., extending horizontally along) an opening in the PCB. Accordingly, at least the a vertical space equal to a thickness of the PCB may avoid becoming wasted mounting space. This results in an improved degree of integration for the electronic device including the PCB mounting the electrolytic capacitor 110.

As noted above, some embodiments of the inventive concept provide a case (e.g., case 120) including at least one dummy electrode pad (e.g., the third electrode pad 121c). Here, the dummy electrode pad is a component irrelevant to charging/discharging the electrolytic capacitor 110. Instead, the dummy electrode pad may mechanically support the electrolytic capacitor 110, as mounted on the PCB. In this regard, the dummy electrode pad(s) may be variously located within the case 120, according to design.

In some embodiments, the dummy electrode pad of the case 120 may electrically float. That is, the dummy electrode pad may not be electrically connected to the anode or the cathode of the electrolytic capacitor 110. Alternately, the dummy electrode pad of the case 120 may be electrically grounded (e.g., connected to the cathode of the electrolytic capacitor 110, for example, by a separate electrically-conductive wire).

Figure 6A:
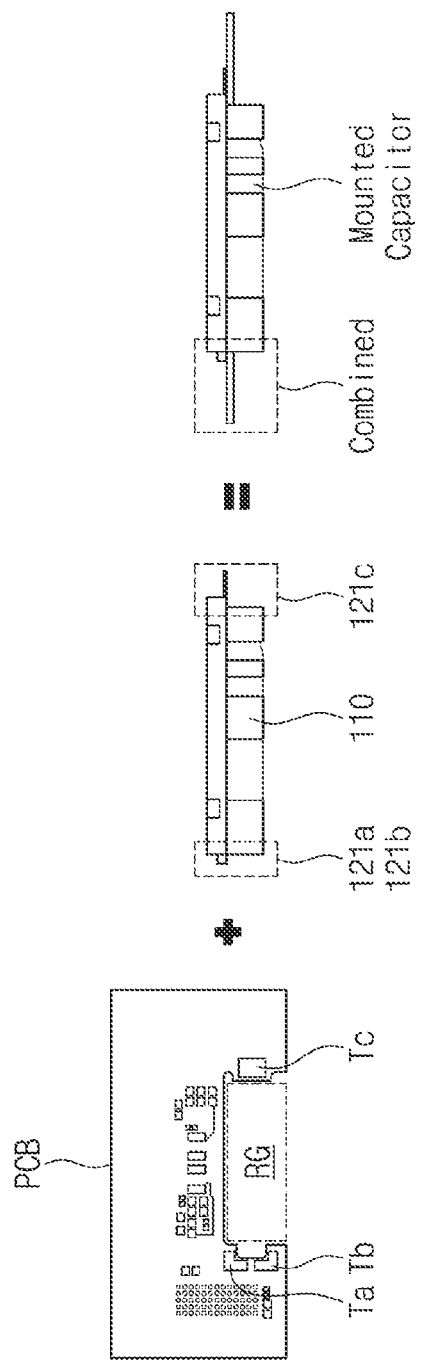
FIG. 6A is a conceptual diagram further illustrating the electronic device of FIG. 5.
Figure 6B:
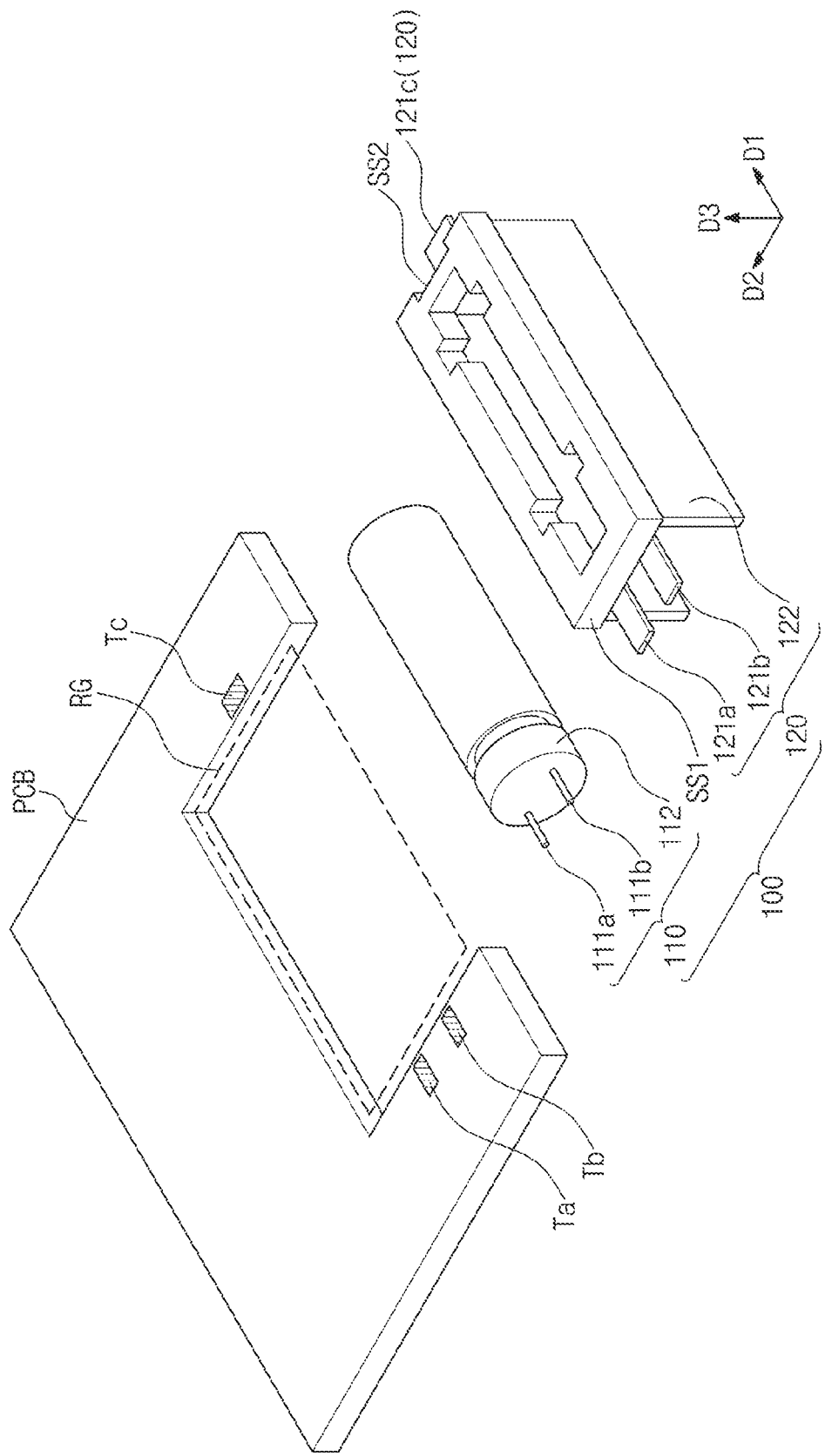
FIG. 6B is an exploded perspective view further illustrating the electronic device of FIG. 5.
Figure 6C:
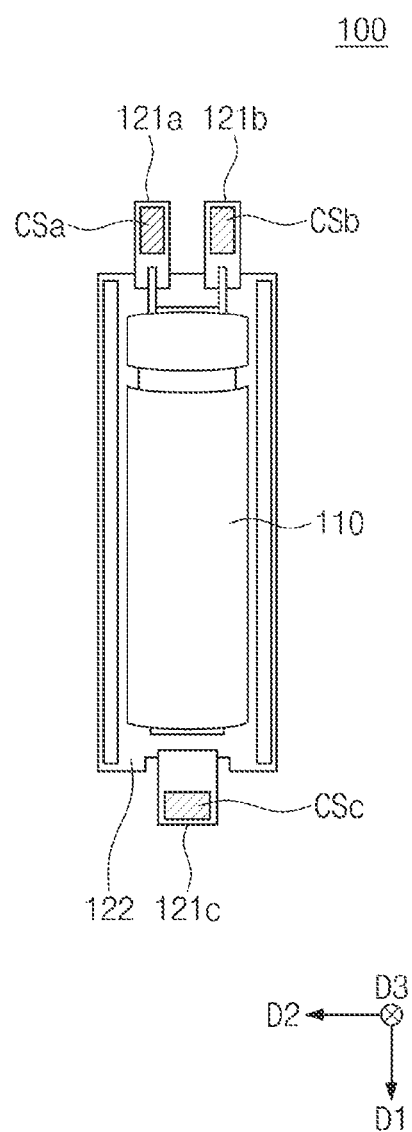
FIG. 6C is a cut-away view further illustrating contact surfaces of a capacitor module according to embodiments of the inventive concept.

FIG. 6A is a conceptual view further illustrating the electronic device of FIG. 5, and FIG. 6B is an exploded perspective view further illustrating the electronic device of FIG. 6A. FIG. 6C is a cut-away view further illustrating contact surfaces (e.g., CSa, CSb, and CSc) of for electrode pads 121a, 121b, and 121c of the case 120.

Referring to FIGS. 6A, 6B and 6C, an electronic device including a PCB and the capacitor module 100 is illustrated. The capacitor module 100 may include the electrolytic capacitor 110 and the case 120. The electrolytic capacitor 110 may include a first electrode 111a, a second electrode 111b, and a dielectric 112. One of the first electrode 111a and the second electrode 111b may be an anode, and the other may be a cathode. The dielectric 112 may be a medium capable of storing electrical energy.

The case 120 may include the first electrode pad 121a, the second electrode pad 121b, the third electrode pad 121c, and the frame 122. The case 120 may principally extend in the first direction D1. The case 120 may have a first side surface SS1 and an opposing (or facing) second side surface SS2 that principally extend in the first direction D1. For example, the first side surface SS1 and the second side surface SS2 may correspond to respective surfaces of the frame 122.

The first electrode pad 121a may be connected to the first side surface SS1 of the case 120, and may mount the first electrode 111a of the electrolytic capacitor 110. The second electrode pad 121b may be connected to the first side surface SS1 of the case 120, spaced apart from the first electrode pad 121a in the second direction D2, and may mount the second electrode 111b of the electrolytic capacitor 110. The third electrode pad 121c may be connected to the second side surface SS2 of the case 120. The case 120 may further include one or more dummy electrode pad(s).

In some embodiments, the electrode pads 121a, 121b, and 121c may include respective contact surfaces. For example, as illustrated in FIG. 6C, the first electrode pad 121a may include the first contact surface CSa, the second electrode pad 121b may include the second contact surface CSb, and the third electrode pad 121c may include the third contact surface CSc. The first, second and third contact surfaces CSa, CSb and CSc may be provided in the same plane. The capacitor module 100 may be mounted on the PCB through the first, second and third contact surfaces CSa, CSb and CSc.

The PCB may include a mounting area RG (e.g., an opening cut into the PCB and having a size sufficient to receive the capacitor module 100) along with the first, second and third contact terminals Ta, Tb and Tc disposed proximate to the mounting area RG. In particular, the mounting area RG have a length in the first direction sufficient to allow the horizontal mounting of the capacitor module 100 on the PCB. In some embodiments, the mounting area RG may have a wider width in the second direction than a width of the capacitor module 100.

In some embodiments, the capacitor module 100 may be mounted on the PCB through a coupling or connection between the contact terminals Ta, Tb, and Tc and the contact surfaces CSa, CSb, and CSc.

In some embodiments, the first, second and/or third contact terminals Ta, Tb and Tc may be respective, flat contact surfaces. Here, for example, the first contact terminal Ta (or the second contact terminal Tb, or the third contact terminal Tc) may be a contact surface extending horizontally across an upper (or lower) surface of the PCB. Alternately, the first contact terminal Ta (or the second contact terminal Tb, or the third contact terminal Tc) may be a contact surface recessed into the PCB and extending across the PCB. Alternately, the first contact terminal Ta (or the second contact terminal Tb, or the third contact terminal Tc) may be a contact surface at least partially disposed within the PCB and extending across the PCB.

In the illustrated example of FIG. 6B, the first contact terminal Ta is connected with the first electrode pad 121a of the capacitor module 100, the second contact terminal Tb is connected with the second electrode pad 121b of the capacitor module 100, and the third contact terminal Tc is connected with the third electrode pad 121c of the capacitor module 100. Thus, the first contact surface CSa of the first electrode pad 121a may contact the first contact terminal Ta, the second contact surface CSb of the second electrode pad 121b may contact the second contact terminal Tb, and the third contact surface CSc of the third electrode pad 121c may contact the third contact terminal Tc. For example, the first, second and third contact surfaces CSa, CSb and CSc of the first, second and third electrode pads 121a, 121b and 121c may be parallel to the first, second and third contact terminals Ta, Tb and Tc.

In this regard, the respective connections between the first, second and third contact terminals Ta, Tb and Tc and the first, second and third contact surfaces CSa, CSb and CSc are not limited to only those described above, and those skilled in the art will recognize that many different approaches to taken to realize these mechanical and/or electrical connections. The first, second and third contact terminals Ta, Tb and Tc may respectively be disposed on an upper and/or a lower surface of the PCB.

The PCB may further include additional structure(s) (e.g., a fourth contact terminal) of varying size(s) and shape(s) that effectively support the mounting of the capacitor module 100 on the PCB.

In some embodiments, the PCB may be manufactured with a size as small as the mounting area RG allows, given the size of the horizontally mounted capacitor module 100. The dielectric 112 of the electrolytic capacitor 110 may have a cylindrical shape defining a diameter (e.g., a total vertical height (up and down from a plane defined by the primary surfaces of the PCB) in the third direction D3) and a radius (e.g., a partial vertical height (up or down from the plane defined by the primary surfaces of the PCB) in the third direction D3).

However, for ease of assembly, handling or troubleshooting the mounting area RG of the PCB may have a width greater than a width of the electrolytic capacitor 110. Accordingly, as the overall size of the PCB may be correspondingly reduced in relation to the mounting area RG, the degree of integration for the electronic device may be improved.

Those skilled in the art will recognize that the foregoing examples of FIGS. 6A, 6B and 6C are merely illustrative in nature. The number, size, shape and position of the contact terminals Ta, Tb, and Tc, as well as the number, size, shape and position of the electrode pads 121a, 121b, and 121c may vary with design, and the scope of the inventive concept is not limited to only the illustrative examples.

Figure 7A:
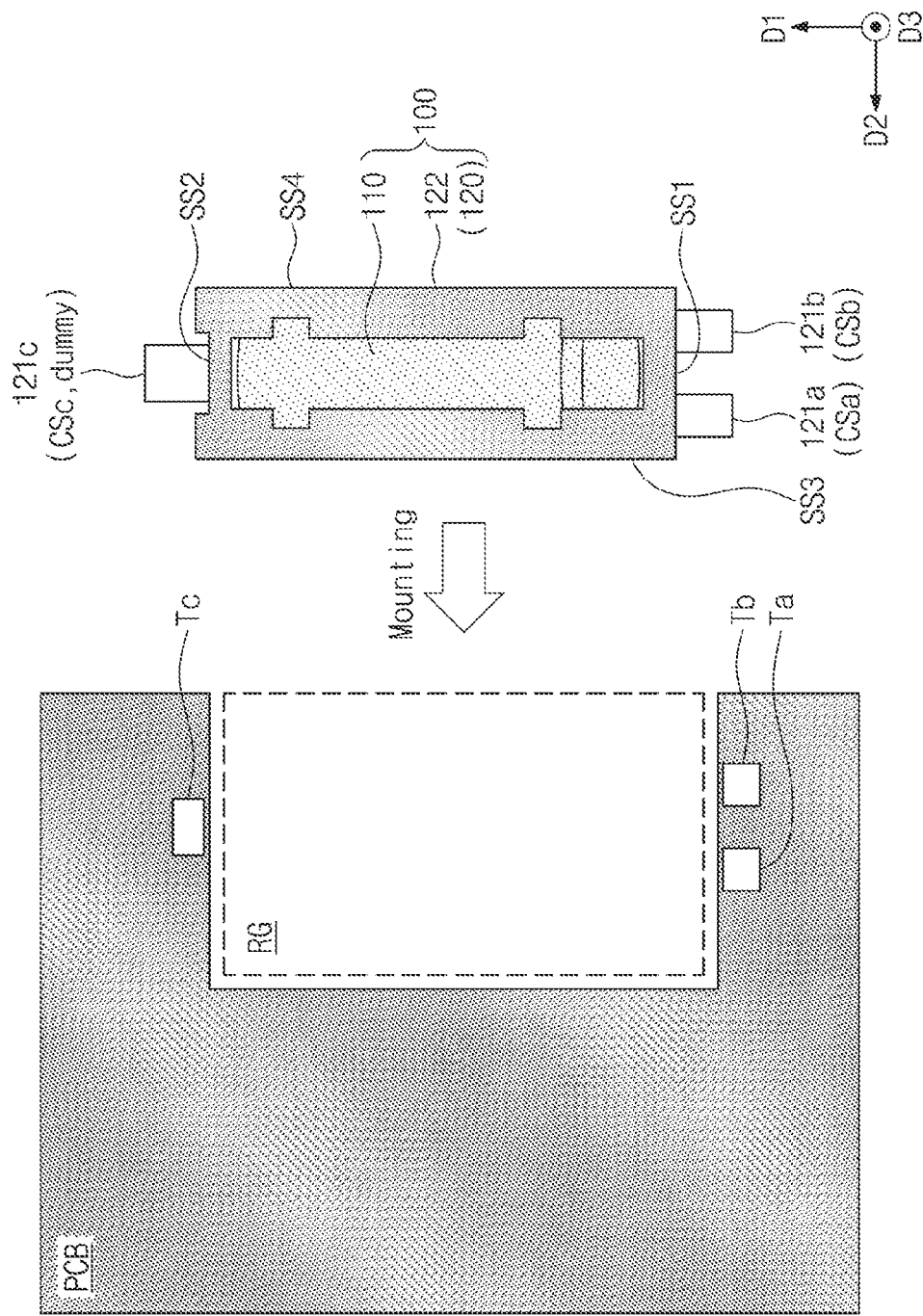
FIGS. 7A, 7B, 7C, 8A, 8B and 8C are respective views variously illustrating electronic devices according to embodiments of the inventive concept.
Figure 7B:
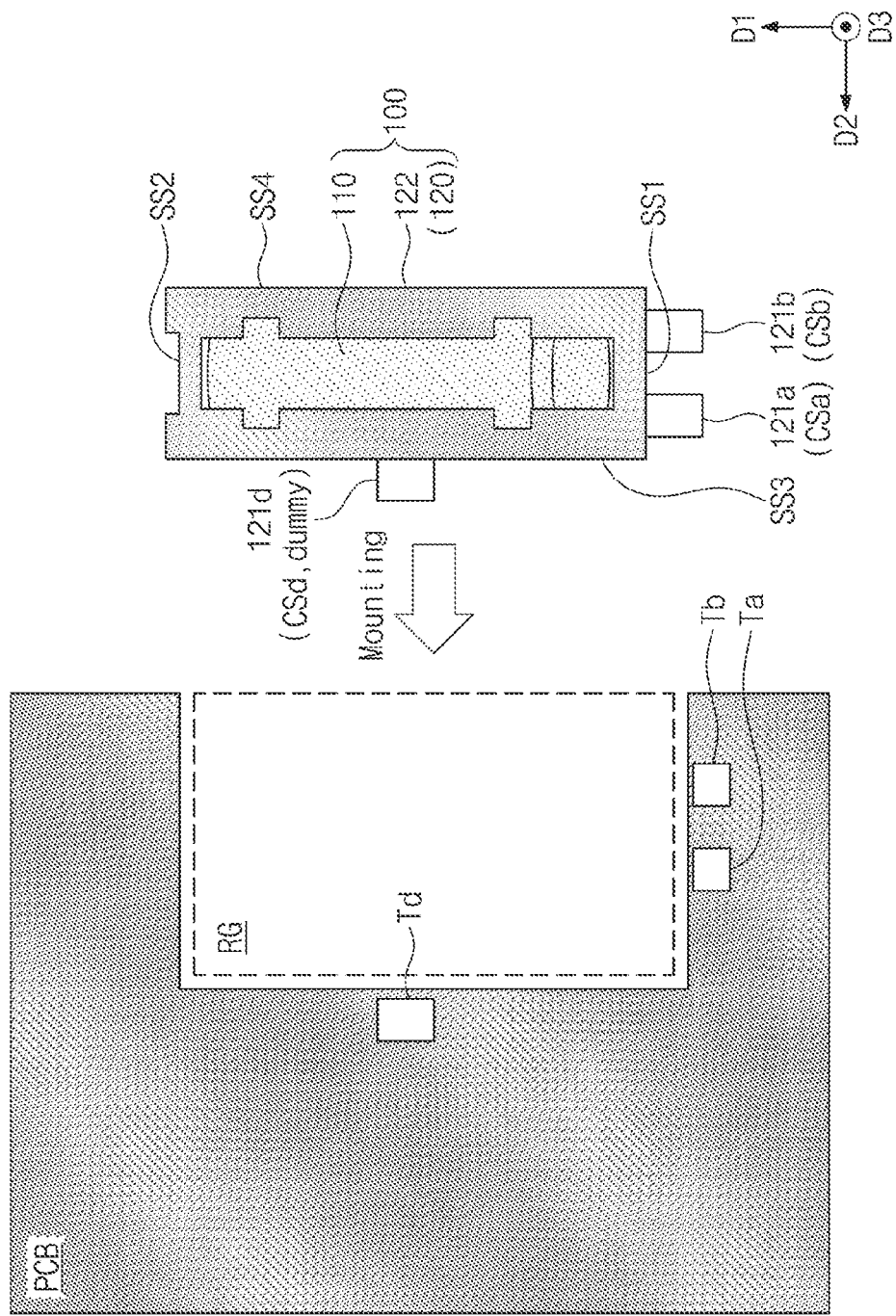
Figure 7C:
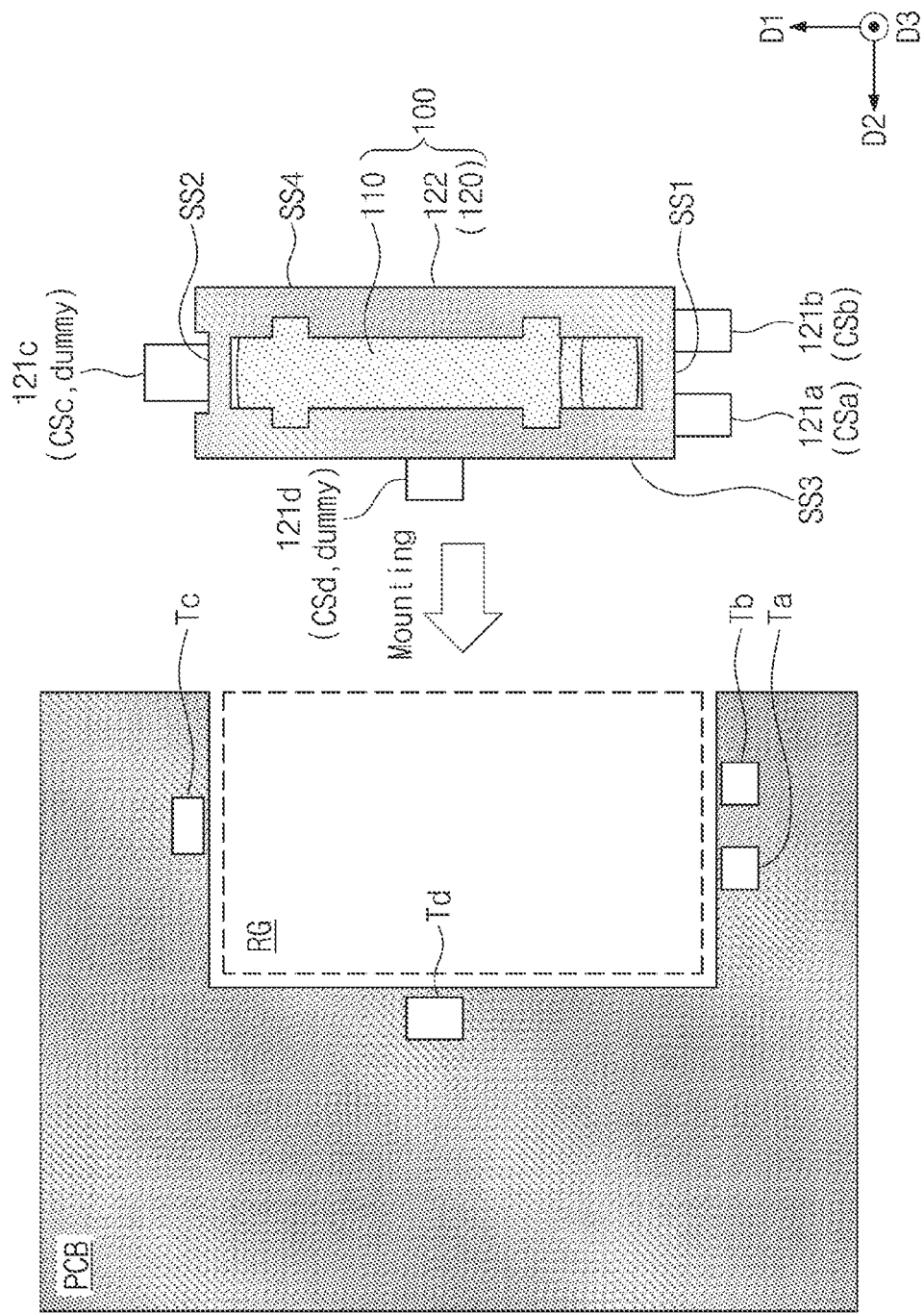

FIGS. 7A, 7B and 7C are views illustrating electronic devices according to embodiments of the inventive concept. Hereinafter, first, second, third and fourth side surfaces SS1, SS2, SS3 and SS4 of a case 120 are noted, and the frame 122 includes corresponding first, second, third and fourth side surfaces SS1, SS2, SS3 and SS4. In the illustrated examples, the first side surface SS1 is disposed at one end of the frame 122 in the first direction D1, and the second side surface SS2 opposes the first side surface SS1. The third side surface SS3 and the opposing fourth surface SS4 connect the first side surface SS1 and the second side surface SS2.

Referring to FIG. 7A, the electronic device includes and PCB and the capacitor module 100 horizontally mounted on the PCB. The capacitor module 100 is assumed to include the electrolytic capacitor 110 and the case 120, wherein the case 120 includes the a first electrode pad 121a, the second electrode pad 121b, the third electrode pad 121c, and the frame 122. The first electrode pad 121a and the second electrode pad 121b may be connected to the first side surface SS1 of the case 120, and the third electrode pad 121c may be connected to the second side surface SS2 of the case 120.

The PCB is assumed to include the mounting area RG, the first contact terminal Ta, the second contact terminal Tb, and the third contact terminal Tc. The first, second, and third contact terminals Ta, Tb, and Tc may be disposed proximate to the mounting area RG. For example, the first contact terminal Ta and the second contact terminal Tb may be disposed adjacent to one another at one end of the area RG, and the third contact terminal Tc may be disposed at another end of the mounting area RG.

The capacitor module 100 may be horizontally mounted within the mounting area RG of the PCB. For example, the first contact surface CSa of the first electrode pad 121a may contact the first contact terminal Ta, the second contact surface CSb of the second electrode pad 121b may contact the second contact terminal Tb, and the third contact surface CSc of the third electrode pad 121c may contact the third contact terminal Tc.

In this regard, the first and second contact surfaces CSa and CSb of the first and second electrode pads 121a and 121b may oppose the third contact surface CSc of the third electrode pad 121c. (See, e.g., FIG. 6C).

In some embodiments, one of the first electrode pad 121a and the second electrode pad 121b is connected to an anode of the electrolytic capacitor 110, and the other is connected to a cathode of the electrolytic capacitor 110. The third electrode pad 121c is a dummy electrode pad.

Referring to FIG. 7B, an electronic device is illustrated that is substantially similar to the electronic device of FIG. 7A, except for the replacement of the third electrode pad 121c at the second side surface SS2 of the electrolytic capacitor 110 with a fourth electrode pad 121d at the third side surface SS3 of the electrolytic capacitor 110, along with the replacement of the third contact terminal Tc on the PCB with a fourth contact terminal Td. Here, instead of opposing the first and second contact surfaces CSa and CSb, the fourth contact terminal Td is disposed on the PCB to receive the fourth electrode pad 121d disposed on the third side surface SS3 of the electrolytic capacitor 110 and to oppose the fourth contact surface CSd of the fourth electrode pad 121d. That is, the capacitor module 100 of FIG. 7B differs from the capacitor module 100 of FIG. 7A in the positioning of the dummy electrode pad.

Referring to FIG. 7C, an electronic device is illustrated that combines both the third electrode pad 121c (a first dummy electrode pad) of FIG. 7A with the fourth electrode pad 121d (a second dummy electrode pad) of FIG. 7B, as well as the corresponding the second contact terminal Tb and fourth contact terminal Td of the PCB. This is an example of an electronic device incorporating more than one dummy electrode pad to mechanically support the capacitor module 100 horizontally mounted on a PCB.

The illustrated embodiments of FIGS. 5, 6A, 6B, 7A, 7B and 7C are respective examples of a capacitor module being horizontally mounted on the PCB in a lengthwise manner. That is the orientation of the mounting area RG in the PCB assumes that the capacitor module will be mounted at least partially within the mounting area according to its length (e.g., defined principally by the greatest dimension of the electrolytic capacitor 110) extending across the horizontal width of the PCB.

Figure 8A:
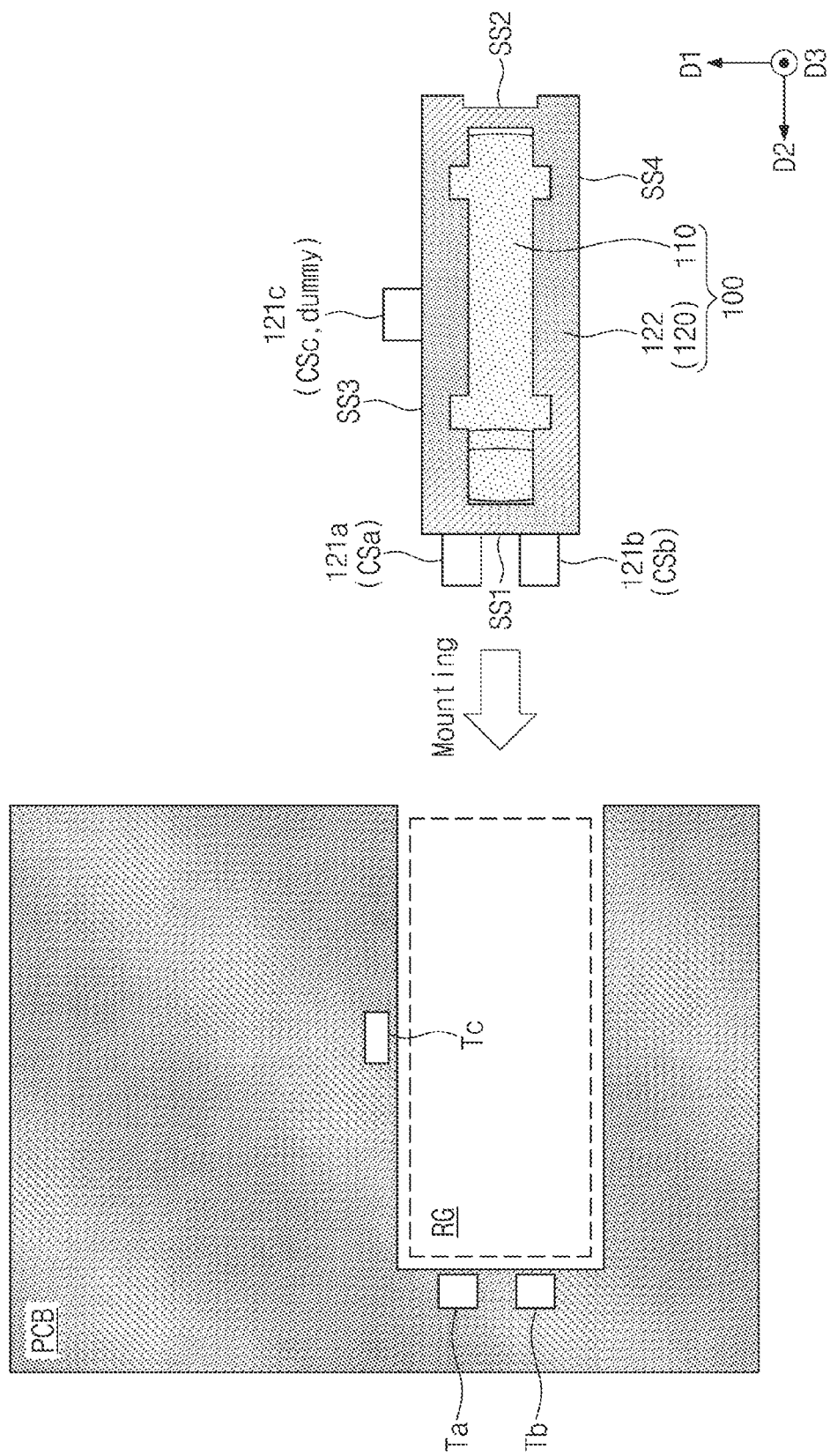
Figure 8B:
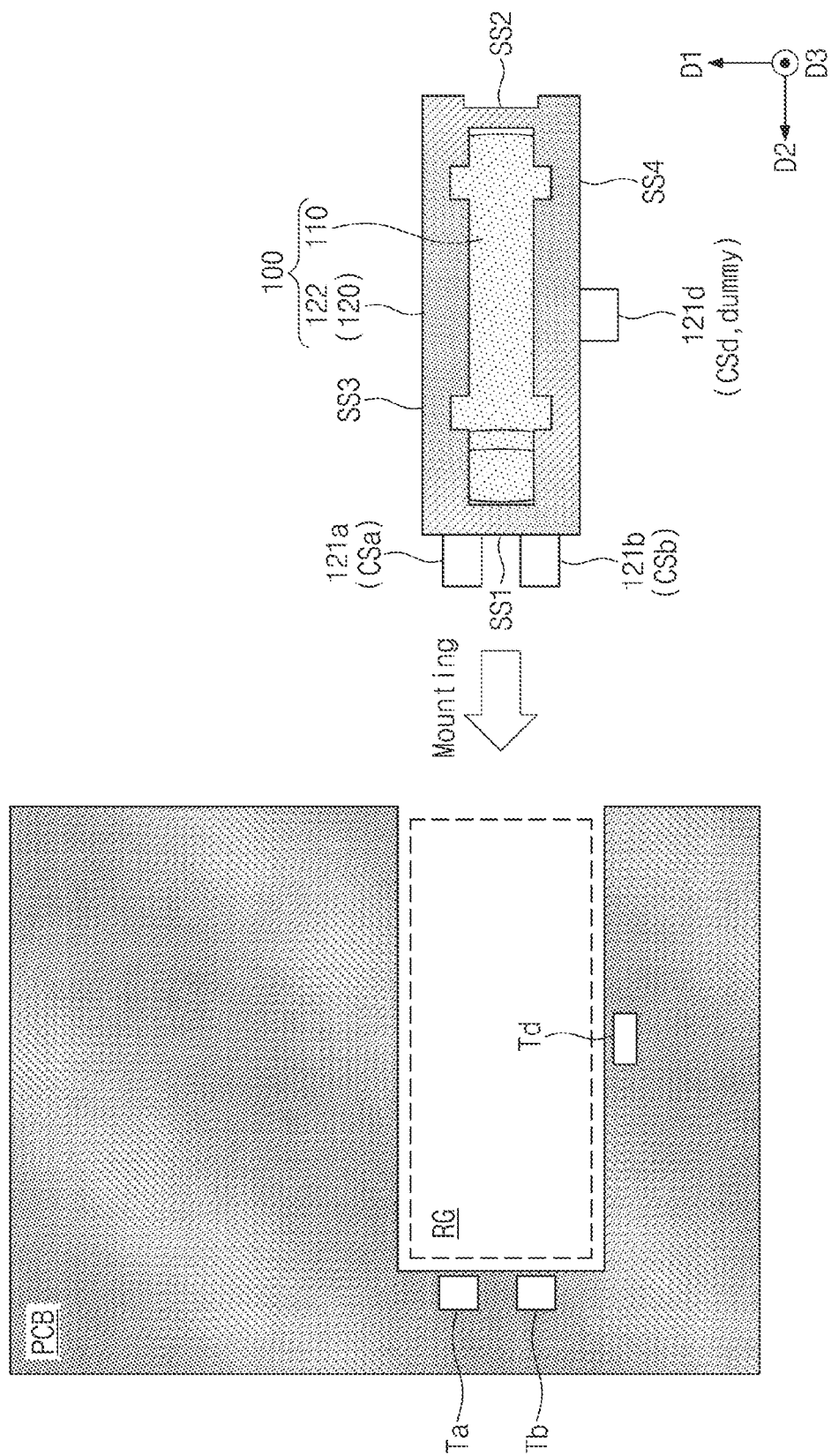
Figure 8C:
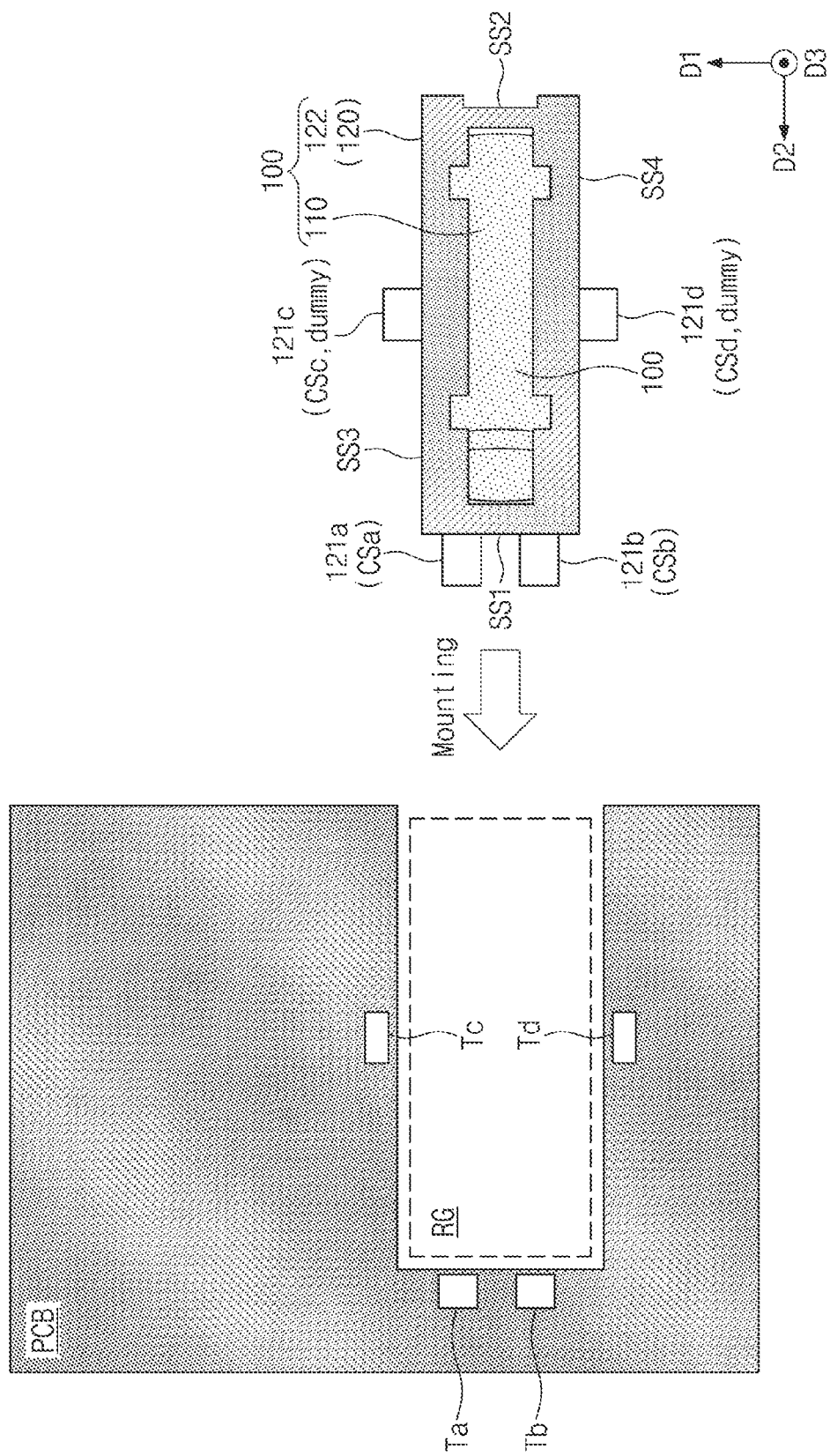

In contrast, FIGS. 8A, 8B and 8C are respective views illustrating electronic devices according to embodiments of the inventive concept including a capacitor module being horizontally mounted on the PCB in a widthwise manner That is, unlike the capacitor modules 100 horizontally mounted on PCBs in a direction perpendicular to the extension of the anode and cathode of the electrolytic capacitors 110 (e.g., the embodiments of FIGS. 7A, 7B and 7C), capacitor modules 100 according to the embodiments illustrated in FIGS. 8A, 8B and 8C may be horizontally mounted PCBs in a direction parallel to the extension of the anode and cathode of electrolytic capacitors 110. As a result, the orientation of the mounting area RG in the PCB may assume that the capacitor module will be mounted at least partially within the mounting area according to its width (e.g., defined principally by a dimension smaller than the greatest dimension of the electrolytic capacitor 110) extending across the horizontal width of the PCB.

Referring to FIG. 8A, an electronic device includes a PCB and the capacitor module 100 horizontally mounted at least partially within the PCB. The capacitor module 100 may again include the electrolytic capacitor 110 and the case 120, wherein the case 120 may include the first electrode pad 121a, the second electrode pad 121b, the third electrode pad 121c, and a frame 122. Here, the first electrode pad 121a and the second electrode pad 121b may be connected to a first side surface SS1 of the case 120, and the third electrode pad 121c may be connected to a third side surface SS3 of the case 120.

The PCB may again include the mounting area RG, the first contact terminal Ta, the second contact terminal Tb, and the third contact terminal Tc, respectively disposed proximate to the mounting area RG. Here, the first contact terminal Ta and the second contact terminal Tb may be adjacent to the mounting area RG in the second direction D2, and the third contact terminal Tc may be adjacent to the mounting area RG in the first direction D1.

As before the capacitor module 100 may be horizontally mounted with the mounting area RG of the PCB. For example, the first contact surface CSa of the first electrode pad 121a may contact the first contact terminal Ta, the second contact surface CSb of the second electrode pad 121b may contact the second contact terminal Tb, and the third contact surface CSc of the third electrode pad 121c may contact the third contact terminal Tc. Here, the first contact terminal Ta and the second contact terminal Tb may be disposed proximate to the first side surface SS1 of the capacitor module 100, when the capacitor module 100 is horizontally mounted on the PCB, and the third contact terminal Tc may be disposed proximate to the third side surface SS3 of the capacitor module 100, when the capacitor module 100 is horizontally mounted on the PCB.

In some embodiments, one of the first electrode pad 121a and the second electrode pad 121b may be connected with an anode of the electrolytic capacitor 110, and the other one of the first electrode pad 121a and the second electrode pad 121b may be connected with a cathode of the electrolytic capacitor 110, whereas the third electrode pad 121c may be a dummy electrode pad.

Referring to FIG. 8B, the capacitor module 100 of FIG. 8B is substantially similar to that of the capacitor module 100 of FIG. 8A, except for the replacement of the third electrode pad 121c at the third side surface SS3 of the electrolytic capacitor 110 with a fourth electrode pad 121d at the fourth side surface SS4 of the electrolytic capacitor 110, along with the replacement of the third contact terminal Tc on the PCB with a fourth contact terminal Td. That is, the capacitor module 100 of FIG. 8B differs from the capacitor module 100 of FIG. 8A in the positioning of the dummy electrode pad.

Referring to FIG. 8C, an electronic device is illustrated that combines both the third electrode pad 121c (a first dummy electrode pad) of FIG. 8A with the fourth electrode pad 121d (a second dummy electrode pad) of FIG. 8B, as well as the corresponding the third contact terminal Tc and fourth contact terminal Td on the PCB. This is another example of an electronic device incorporating more than one dummy electrode pad to mechanically support the capacitor module 100 horizontally mounted on a PCB.

Figure 9A:
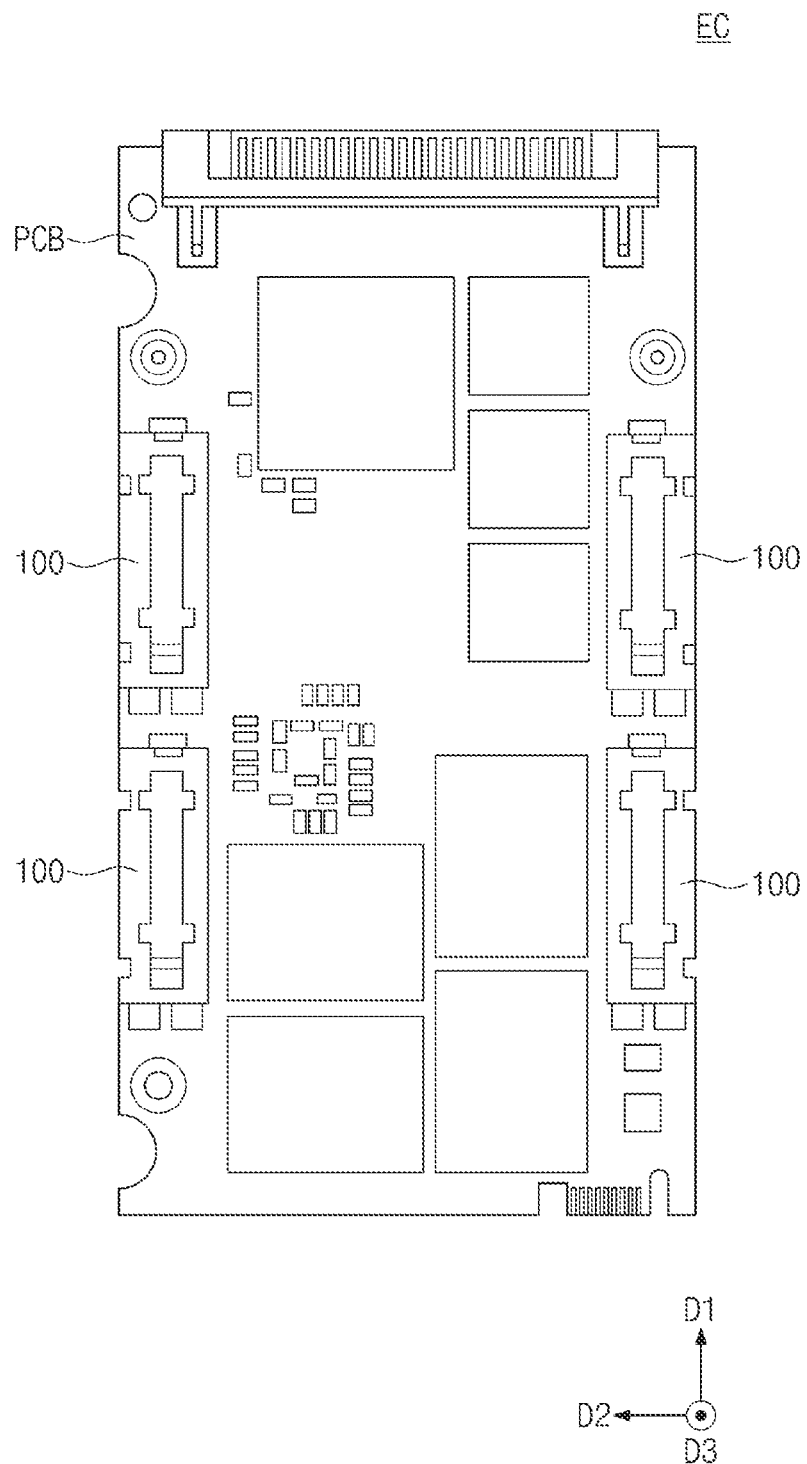
FIG. 9A is a plan (or top-down) view illustrating an electronic device including capacitor modules according to embodiments of the inventive concept.

FIG. 9A is a plan view (e.g., downward in the third direction D3) illustrating an upper surface of a PCB of an electronic circuit EC including a plurality of capacitor modules 100 horizontally mounted on the constituent PCB according to embodiments of the inventive concept.

Here, for example, the electronic device EC assumes that four (4) capacitor modules 100 are horizontally mounted on a single PCB. However, this is just one example and the scope of the inventive concept is not limited thereto, as any reasonable number of capacitor modules 100 may be horizontally mounted on one or more PCBs within the electronic circuit EC.

In some embodiments, the electronic circuit EC may also include may other components (a conductive pattern, a resistor, integrated circuits or chips, logic gates, a buffer memory, a nonvolatile memory, etc.) mounted on upper an/or lower surfaces of the PCB using (e.g.) various surface mounting technologies.

Since the plurality of capacitor modules 100, as well as the other electronic components may be mounted on the PCB using a surface mounting technology as described above, productivity of the electronic circuit EC may be improved, as compared with manufacturing approaches that include a mix of processes such as hand soldering. As a result, defect rates for the electronic circuit EC will be relatively low.

Figure 9B:
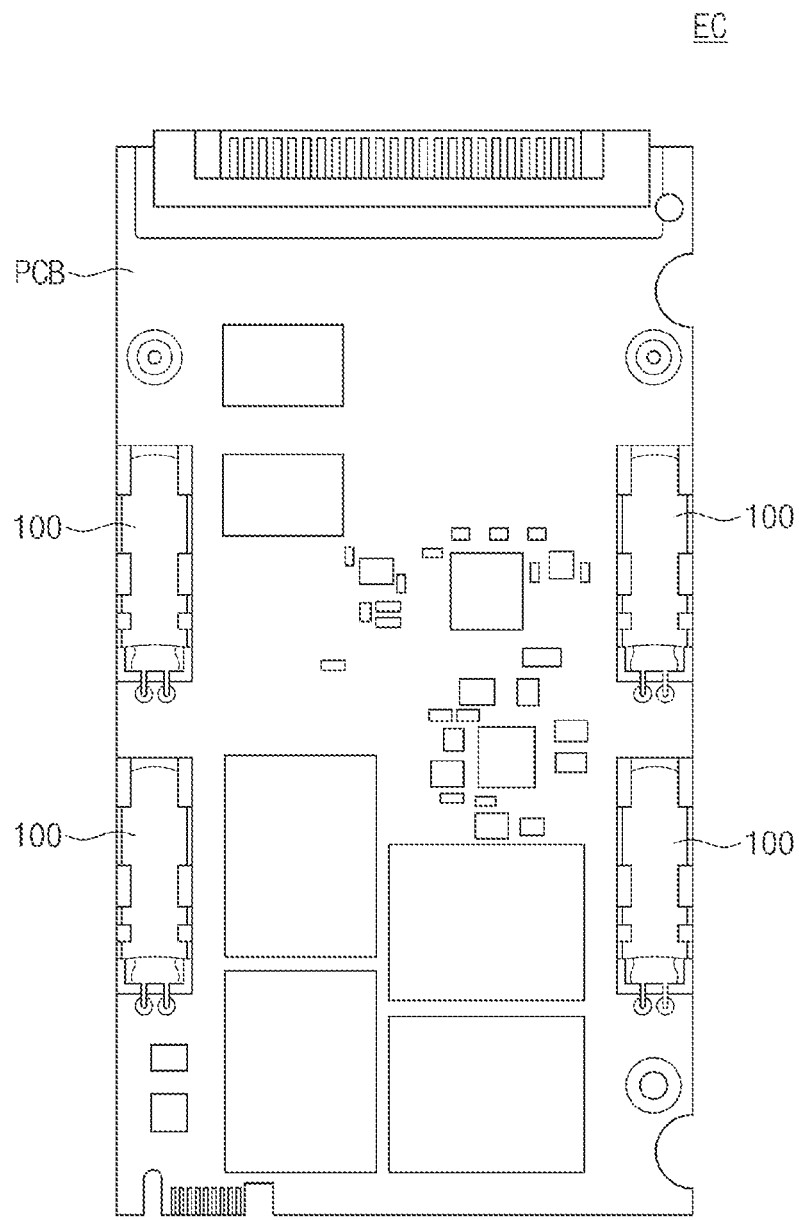
FIG. 9B is a reverse view of the electronic device of FIG. 9A.

FIG. 9B is a plan view (e.g., up in the third direction D3) illustrating a lower surface of the PCB of the electronic circuit EC including the plurality of capacitor modules 100 horizontally mounted on the constituent PCB according to embodiments of the inventive concept. That is, FIG. 9B is a reverse plan view of FIG. 9A.

As illustrated in FIGS. 9A and 9B, the electronic circuit EC may include the plurality the capacitor modules 100, wherein each capacitor module 100 includes an electrolytic capacitor and is horizontally mounted on the PCB, as described above. Accordingly, the degree of integration for the electronic circuit EC may be improved.

FIG. 10 is a perspective view illustrating an electronic device ED according to embodiments of the inventive concept. Referring to FIG. 10, the electronic device ED may include the electronic circuit EC of FIGS. 9A and 9B, together with a cover case CC. In some embodiments, the electronic device ED may be an SSD.

Here, the cover case CC may protect the electronic circuit EC from environmental effects and mechanical impacts. For example, the electronic device ED may include the cover case CC disposed on one side of the electronic circuit EC. Alternately, the electronic device ED may further include another cover case (not illustrated) disposed on an opposite side of the electronic circuit EC, wherein the two (2) cover cases CC may be combined together to fully enclose the electronic circuit EC there between.

In some embodiments, the cover case CC may include one or more I/O port terminal(s) extending through the cover case CC to connect the PCB with an external device. In this manner, the electronic device ED and the external device may be hard wired via the I/O port terminal(s).

According to the embodiments of the inventive concept, the degree of integration related to vertical mounting space may be improved by horizontally mounting the capacitor module on the PCB. In addition, the productivity of an electronic device or circuit may be improved by application of fully automated manufacturing processes, such as surface mounting technology. Further, the structural stability of the resulting device or circuit may be improved by the addition of the one or more dummy electrode pads mechanically supporting the capacitor module when the capacitor module is horizontally mounted on the PCB.

The foregoing embodiments are illustrative in nature. Changes and modifications to the illustrative embodiments may be mad without removing the resulting devices from the scope of the inventive concept.

What is claimed is:

1. A capacitor module, comprising:
    a case horizontally mounted on a printed circuit board (PCB),
    the case having principal surfaces horizontally extending in a first direction and a second direction perpendicular to the first direction, and including a first side surface, a second side surface opposing the first side surface, a first electrode pad and a second electrode pad extending from the first side surface along the first direction, and a third electrode pad extending from the second side surface along the first direction; and
    an electrolytic capacitor disposed in the case, the electrolytic capacitor including a dielectric extending in the first direction, a first electrode electrically connected to the first electrode pad and a second electrode electrically connected to the second electrode pad, wherein the second electrode pad is spaced apart from the first electrode pad in the second direction.

2. The capacitor module of claim 1, wherein one of the first electrode and the second electrode is an anode of the electrolytic capacitor, and an other one of the first electrode and the second electrode is a cathode of the electrolytic capacitor.

3. The capacitor module of claim 1, wherein at least one of the first electrode pad and the second electrode pad is configured to mechanically support the capacitor module mounted on the PCB.

4. The capacitor module of claim 1, wherein the third electrode pad is a dummy electrode pad configured to mechanically support the capacitor module mounted on the PCB.

5. The capacitor module of claim 4, wherein the third electrode pad is electrically floating.

6. The capacitor module of claim 4, wherein the third electrode pad is grounded.

7. The capacitor module of claim 6, wherein one of the first electrode and the second electrode is a cathode of the electrolytic capacitor, and the third electrode pad is electrically connected with the cathode.

8. The capacitor module of claim 1, wherein the case further comprises:
a third side surface connecting the first side surface and the second side surface; and
a fourth electrode pad extending from the third side surface along the second direction.

9. The capacitor module of claim 8, wherein each of the third electrode pad and the fourth electrode pad is a dummy electrode pad configured to mechanically support the capacitor module mounted on the PCB.

10. The capacitor module of claim 9, wherein each of the third electrode pad and the fourth electrode pad is electrically floating or grounded.

11. An electronic device comprising:
a printed circuit board (PCB) having principal surfaces horizontally extending in a first direction and a second direction perpendicular to the first direction and including a mounting area, a first contact terminal, a second contact terminal and a third contact terminal;
a case configured to be horizontally mounted on the PCB at least partially within the mounting area and including a first side surface, a second side surface opposing the first side surface, a first electrode pad and a second electrode pad extending from the first side surface along the first direction, and a third electrode pad extending from the second side surface along the first direction; and
an electrolytic capacitor including a dielectric extending in the first direction, a first electrode and a second electrode spaced apart from the first electrode in the second direction,
wherein the electrolytic capacitor is mounted on the case by connection of the first electrode to the first electrode pad and connection of the second electrode to the second electrode pad, and
the case is horizontally mounted within the mounting area of the PCB by connection of the first electrode pad to the first contact terminal, the second electrode pad to the second contact terminal, and the third electrode pad to the third contact terminal.

12. The electronic device of claim 11, wherein one of the first electrode and the second electrode is an anode of the electrolytic capacitor, and an other one of the first electrode and the second electrode is a cathode of the electrolytic capacitor.

13. The electronic device of claim 11, wherein the third electrode pad is a dummy electrode pad configured to mechanically support the case when the case is horizontally mounted on the PCB.

14. The electronic device of claim 11, wherein the PCB further includes a fourth contact terminal,
the case further includes a third side surface connecting the first side surface and the second side surface, and a fourth electrode pad extending from the third side surface along the second direction, and
the case is horizontally mounted within the mounting area of the PCB by further connection of the fourth electrode pad to the fourth contact terminal.

15. The electronic device of claim 14, wherein the third electrode pad and the fourth electrode pad are dummy electrode pads configured to mechanically support the case when mounted on the PCB, and
each of the third electrode pad and the fourth electrode pad is electrically floating or grounded.

16. The electronic device of claim 11, wherein the mounting area is disposed within the PCB to receive and mount the case in one of a lengthwise manner and a widthwise manner.

17. The electronic device of claim 11, further comprising:
a cover case that substantially encompasses at least one of an upper surface of the PCB and a lower surface of the PCB.

18. A capacitor module configured to be horizontally mounted on a printed circuit board (PCB), the PCB having an upper surface and a lower surface horizontally extending in a first direction and a second direction perpendicular to the first direction, the capacitor module comprising:
a case including a frame, a first side surface, a second side surface opposing the first side surface, a third side surface connecting the first and second side surfaces, a first electrode pad and a second electrode pad extending from the first side surface along the first direction, and a third electrode pad extending from the third side surface along the second direction; and
a cylindrical electrolytic capacitor in the case, the cylindrical electrolytic capacitor including a dielectric extending in the first direction, a first electrode contacting the first electrode pad and a second electrode contacting the second electrode pad,
wherein the first electrode pad is spaced apart from second electrode pad in the second direction, and the frame substantially surrounds side surfaces of the cylindrical electrolytic capacitor.

19. The capacitor module of claim 18, wherein one of the first electrode and the second electrode is an anode of the cylindrical electrolytic capacitor, and an other one of the first electrode and the second electrode is a cathode of the cylindrical electrolytic capacitor, and
the third electrode pad is a dummy electrode pad configured to mechanically support the capacitor module when mounted on the PCB.

20. The capacitor module of claim 18, wherein the cylindrical electrolytic capacitor is an aluminum electrolytic capacitor.

* * * * *